United States Patent [19]
Harris

[11] 3,970,591
[45] July 20, 1976

[54] ELECTRICAL DISCHARGE DEVICE COMPRISING AN INSULATOR BODY HAVING AN ELECTRICALLY SEMI-CONDUCTING COATING FORMED THEREON

[75] Inventor: Robert C. Harris, Unadilla, N.Y.

[73] Assignee: The Bendix Corporation, Southfield, Mich.

[22] Filed: Dec. 9, 1974

[21] Appl. No.: 530,921

Related U.S. Application Data

[62] Division of Ser. No. 480,199, June 17, 1974.

[52] U.S. Cl. ............................ 252/521; 252/518; 252/519; 428/539
[51] Int. Cl.² .......................... H01B 1/06; H01C 1/06
[58] Field of Search ............... 252/518, 519, 521; 313/130, 131, 131.1 A; 428/539

[56] References Cited
UNITED STATES PATENTS

| | | |
|---|---|---|
| 2,797,175 | 6/1957 | Horton ............................... 252/519 |
| 2,861,014 | 11/1958 | Sheheen et al ................. 313/131 R |
| 2,953,704 | 9/1960 | Harris ................................ 313/131 |
| 3,558,959 | 1/1971 | Ziemendorf ..................... 313/131 |
| 3,565,684 | 2/1971 | Buck ................................. 252/521 |

*Primary Examiner*—Benjamin R. Padgett
*Assistant Examiner*—Josephine Lloyd
*Attorney, Agent, or Firm*—Parmelee, Miller, Welsh & Kratz

[57] ABSTRACT

An electrical discharge device and in particular a low voltage or shunt-type igniter plug is disclosed, said plug having a beryllium oxide ceramic insulator disposed between the center electrode firing tip and the ground electrode, said insulator having a novel semi-conducting metal oxide coating formed thereon to provide an ionized path along which spark discharge between said electrodes occurs.

2 Claims, 2 Drawing Figures

3,970,591

ELECTRICAL DISCHARGE DEVICE COMPRISING AN INSULATOR BODY HAVING AN ELECTRICALLY SEMI-CONDUCTING COATING FORMED THEREON

This is a division of application Ser. No. 480,199, filed June 17, 1974.

BACKGROUND OF THE INVENTION

Electrical discharge devices, such as igniter plugs, particularly those intended for use in aircraft engines of the jet or internal combustion types, are subject to a number of environmental extremes, extremes of temperature being probably the severest factor to which an igniter plug and its components are subjected. If the plug is of the high-voltage type, generally about 15,000 to 25,000 volts are required to cause an electrical discharge across the spark gap, which high voltages further aggravate the hostility of the environment to which the plug is exposed. Moreover, due to difficulties in properly insulating high voltage systems, flashover problems between adjacent components, in the electrical cable and in the ignition system itself are frequently encountered.

Consequently, low voltage, i.e., from about 1,000 to 5,000 volts, ignition systems have been developed, which systems require the use of a low voltage or shunted gap-type igniter plug, which is supplied with low voltage, high energy from a capacitor discharge system. In a shunt-type plug, the gap between the center electrode and the outer shell or ground electrode is bridged by a semi-conducting ceramic material which when pulses at low voltage allows the stored energy from the capacitors to discharge to ground across the igniter plug tip. Thus the ceramic tip which comprises the bridge member must possess certain physical and electrical characteristics to function properly in the environmental extremes created in modern engines and, in particular, jet aircraft engines.

In general, shunted ceramic tips are of two varieties, a surface treated insulator and the homogenous type wherein the entire insulator is a semi-conductor. An example of the former is described in U.S. Pat. No. 2,953,704, wherein an aluminum oxide ceramic insulator is coated with a sintered mixture of cuprous oxide and ferric oxide. An example of the latter is described in U.S. Pat. No. 3,558,959, wherein a semi-conducting ceramic body is formed of bonded particles of silicon carbide.

In the continuing search for improved materials to resist heat, thermal shock, spark erosion, and in general the hostile environment of modern engines, insulators comprised essentially of beryllium oxide have been found to be superior to more commonly used aluminum oxide insulators, both with respect to improved thermal conductivity and resistance to thermal shock. However, semi-conducting coatings developed for aluminum oxide based ceramics have proven unsatisfactory when applied to beryllium oxide ceramics.

OBJECTS OF THE INVENTION

It is, therefore, an object of this invention to provide an improved low-voltage igniter plug for jet and internal combustion engines.

It is another object of this invention to provide an improved semi-conducting surface for shunted gap-type igniter plugs.

It is a further object of this invention to provide an electrically semi-conducting coating for use in shunted gap-type igniter plugs having an insulator formed of beryllium oxide.

It is an additional object of this invention to provide a low-voltage igniter plug having an electrically semi-conducting lower tip comprised of a beryllium oxide insulator coated with a smooth, low resistance, semi-conducting layer.

It is yet another object of this invention to provide an electrically semi-conducting metal oxide coating suitable for application to beryllium oxide insulator bodies.

The foregoing objects and others will become apparent from the following description with reference to the accompanying drawings which are illustrative only of preferred embodiments of the invention.

DESCRIPTION OF THE INVENTION

Figure 1:
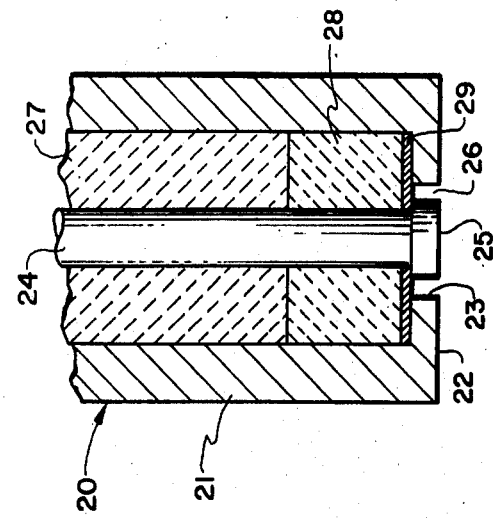
FIG. 1 is a partially schematic view, in longitudinal cross section, of the lower tip portion of an igniter plug embodying the invention.

With reference to FIG. 1, a low-voltage igniter plug 10 comprises a hollow, cylindrical body shell 11 which is generally made of a nickel-steel alloy. The lower extremity of shell 11 is formed as a radially inwardly directed flange 12. The inner edge surface 13 of flange 12 is cylindrical and coaxial with the shell 11, which surface 13 of flange 12 constitutes a ground electrode. A central electrode 14 extends longitudinally within the shell 11 and is coaxial therewith, the firing tip 15 of the electrode 14 terminating in spaced relationship with the surface 13 thus forming an annular spark gap 16. When the plug 10 is installed in an engine, the flanged portion 12 is in direct communication with the combustion chamber of the engine and is grounded to the engine by contact between the shell 11 and the engine block. The upper end of central electrode 14 is seated in an annular insulating member 17 disposed within the shell 11 which insulates the central electrode 14 from the shell 11. The insulating member 17 may be formed of any suitable insulating material such as porcelain, borosilicate glass, aluminum oxide ceramic, beryllium oxide ceramic or the like. Another insulating member 18, formed principally of beryllium oxide, is annularly disposed about the lower end of the central electrode 14, and extends from the lower end of insulating member 17 to the upper radially inwardly directed surface of the flange 12. The lower periphery and the lower face of the insulating member 18 is coated with a semi-conducting layer 19, said layer 19 being in intimate contact with the lower end of the central electrode 14 and the upper insulating member 17 may be formed surface of the radially inwardly directed flange 12, whereby current flow can occur across the semi-conducting coating 19 upon the application of low voltage, the current flow resulting in ionization of the spark gap 16, thus enabling a high energy, low voltage spark to discharge across the gap 16 and between the firing tip 15 of the central electrode 14 and the surface 13 of flange 12.

Figure 2:
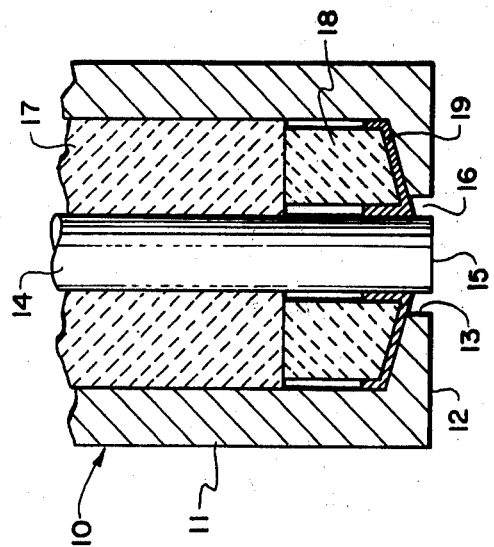
FIG. 2 is a view similar to FIG. 1, showing a differently configured lower tip portion of an igniter plug embodying the invention.

With reference to FIG. 2, a low voltage igniter plug 20 comprises a hollow, cylindrical body shell 21. The lower extremity of body shell 21 is formed as a radially inwardly directed flange 22, the inner edge surface 23 of which is cylindrical and coaxial with the shell 21 which surface 23 of flange 22 constitutes a ground electrode. A central electrode 24 extends longitudinally within the shell 21 and coaxial therewith, the lower end of electrode 24 terminating in an annular, outwardly directed flange 25, said flange 25 having a lesser diameter than the diameter of radially inwardly directed flange 22 of shell 21, said flanges defining between them an annular spark gap 26. The upper end of central electrode 24 is seated in an annular insulating member 27 disposed within body shell 21, which insulates the central electrode 24 from the shell 21. The insulating member 27 may be formed of any suitable insulating material, such as porcelain, borosilicate glass, aluminum oxide ceramic, beryllium oxide ceramic or the like. Another insulating member 28 formed principally of beryllium oxide is annularly disposed about the lower end of the central electrode 24 and extends from the lower end of insulating member 27 to both the upper surface of flange 22 and the upper surface of flange 25, forming a bridge across the spark gap 26 formed between flange 25 and surface 23 of flange 22. The lower face of the insulating member 28 is coated with a semi-conducting layer 29, said layer 29 being in intimate contact with the upper surfaces of flanges 22 and 25, whereby current flow can occur along the semi-conducting coating 29 upon the application of low voltage, the current flow resulting in ionization of the spark gap 26, thus enabling a high energy, low voltage spark to discharge across the gap 26 and between flange 25 of central electrode 24 and surface 23 of flange 22.

As described hereinabove, the electrically semi-conducting layer (designated at 19 in FIG. 1 and at 29 in FIG. 2) which shunts the electrodes of the spark gap is in the form of a film-like coating formed on the beryllium oxide ceramic insulator member. The semi-conducting layer is comprised of a fired mixture of lanthanum oxide ($La_2O_3$) and copper oxide, preferably cuprous oxide ($Cu_2O$). The said mixture may also contain iron oxide, preferably ferric oxide ($Fe_2O_3$). The firing of the mixture of oxides is carried out at such temperature and for such length of time that at least one of the oxides is sintered, i.e. heated to the point of incipient fusion. The liquid vehicle in which the oxides are preferably applied to the beryllium oxide substrate is driven-off or volatilized and the resulting electrically semi-conducting layer is compacted into a low resistance, smooth-surfaced coating layer which is firmly bonded to the surface of the beryllium oxide substrate.

In order to function satisfactorily in electrical discharge devices, such as low voltage igniter plugs, an electrically semi-conducting layer shunting the electrodes of such plugs must have a relatively smooth and unblemished outer surface confronting the gap; a relatively low resistivity both initially and during the life of the plug under the varying temperatures and other service conditions encountered during use; and must be well-bonded to the ceramic refractory substrate. Unless the semi-conducting layer is smooth and substantially free from imperfections, it will not function uniformly over the area of the spark gap. Unless such layer is of relatively low resistivity, i.e. from about 10,000 to about 500,000 ohms, preferably from about 10,000 to about 100,000 ohms, it will not sufficiently strongly ionize the gap between the electrodes prior to spark discharge. Unless the layer is well-bonded to the ceramic substrate, it will flake or spall-off the substrate under prolonged, arduous service conditions.

It has been found that an electrically semi-conducting coating material possessed of the above-mentioned desirable properties and suitable for coating predominantly beryllium oxide (i.e. from about 75 to 99 percent by weight BeO) based ceramic insulator bodies comprises a sintered mixture of from 25 to 90 percent by weight lanthanum oxide ($La_2O_3$), from 5 to 75 percent by weight cuprous oxide ($Cu_2O$) and from 0 to 25 percent by weight ferric oxide ($Fe_2O_3$). A preferred semi-conducting coating comprises a sintered mixture of from 65 to 90 percent by weight lanthanum oxide ($La_2O_3$), from 10 to 30 percent by weight cuprous oxide ($Cu_2O$) and from 0 to 5 percent by weight ferric oxide ($Fe_2O_3$).

The above ranges of weight percentages of the said oxides were determined by preparing about 250 mixtures of lanthanum, cuprous and ferric oxides of broadly varying compositions ranging from 0 to 100 percent by weight lanthanum oxide, from 0 to 100 percent by weight cuprous oxide and from 0 to 100 percent by weight ferric oxide and coating each composition on individual beryllium oxide discs as will be more fully described hereinafter. The coated discs were fired at temperatures ranging from 2150° to 2450°F and the resistance of the fired coatings was measured. The resistance values were plotted on ternary diagrams and correlated with the respective metal oxide composition which yielded the respective resistance value. Metal oxide compositions in the above ranges were, from analyses of the ternary diagrams, found to produce coatings having acceptable low resistance properties and, a fortiori, would be suitable in the preparation of electrically semi-conducting coatings particularly compatible with beryllium oxide ceramic substrates.

The coating is preferably prepared, generally speaking, by grinding the dry oxides to a fine powder and slurrying the same with a liquid media comprising water, a wetting agent and a glycol. The oxide slurry is painted on the beryllium oxide substrate by brushing or spraying to a thickness of between about 0.005 to 0.010 inches (5 to 10 mils). The coated substrate is then fired in a kiln or the like at a temperature of from about 2150° to 2450°F until a smooth coated surface is observed, the liquid carrier, of course, being volatilized. As the beryllium oxide is somewhat porous, the coating will to some extent penetrate the pores, thus enhancing the adherence of the coating to the substrate.

The composition of preferred embodiments of electrically semi-conducting coatings on beryllium oxide ceramic substrates in accordance with the invention and a preferred manner of forming electrically semi-conducting coatings on beryllium oxide ceramic substrates are set forth in the following example, which example is intended solely for the purpose of illustration and is not to be construed as in anyways limiting the scope of the invention.

EXAMPLE 1

A series of one-gram samples of lanthanum oxide ($La_2O_3$ Kerr-McGee, Code 528), cuprous oxide ($Cu_2O$, Fisher C-477, Lot 72351) and ferric oxide ($Fe_2O_3$, Columbia 347 Grade) having the weight percentages indicated in Table 1 are prepared, each constituent of each sample being weighed, on a Mettler H15 analytical balance, to the nearest milligram. The dry oxides constituting each sample are ground together in a mortar and pestle and are placed in individual plastic vials. To each vial is added the following.

| | |
|---|---|
| Glycerol | 3 drops |
| Tergitol No. 4 (trade name for a wetting agent manufactured by Union Carbide Corp.) | 2 drops |
| Distilled Water | 12 drops |

Note: The "drops" in which the volumes of glycerol, Tergitol No. 4 and water are given are drops from a standard analytical burette.

The dry oxides are thoroughly mixed with the liquid additives to form a uniform slurry or suspension of the oxides in the liquid carrier. Each slurried sample is painted on a separate disc of beryllium oxide, each disc measuring approximately 0.5 inches in diameter by 0.070 inches thick and having a BeO content of about 99 percent by weight. To assure uniform application of each sample on each disc the following procedure is used.

Pressure sensitive masks or stencils are made by punching 0.25 inch diameter holes in masking tape, cutting off a section containing one hole and pressing the tape section onto a disc, positioning the hole in the center of the disc. Each sample is then painted, to a thickness of about 5 mils, over the hole in the tape section and when the mask is peeled away a 0.25 inch diameter sample is centered and coated on each disc.

The discs are then fired in an electrically heated resistance element-type kiln (Burrell, Model 90) to the temperatures indicated in Table 1. The samples are heated at about 200°F. per hour to a temperature of about 800°F to evaporate the liquid carrier after which heating is continued at a rate of about 400°F per hour until the desired temperature is attained, Orton pyrometric cones being used to indicate the heat output and uniformity of firing. After firing, the discs are cooled and observed for smoothness and uniformity of coating. The resistance of the sintered coating is measured at 22°C with a Simpson 260 Ohmeter, the resistance for each sample at the respective firing temperature is tabulated in Table 1, in Ohms $\times 10^4$.

As shown by the data presented in Table 1, the semi-conducting metal oxide coating compositions according to the invention (Samples No. 1 through 22) each have satisfactory resistances when coated on a beryllium oxide insulator material. It will be observed that, generally speaking, the resistance of the coating increases with increasing firing temperature, and significantly increases at a firing temperature of 2450°F, as exemplified by firing a number of said samples at that temperature, which temperature of 2450°F is believed to be about the upper limit at which the coating can be fired and still retain satisfactory semi-conducting properties.

Samples No. 25 through 28 demonstrate that prior art semi-conducting coatings consisting of mixtures of cuprous oxide and ferric oxide, as taught in the aforementioned U.S. Pat. No. 2,953,704, though satisfactory when coated on aluminum oxide ceramics, are unsatisfactory when coated, as here, on a beryllium oxide ceramic, the coatings being electrically non-conducting in the latter instances.

Samples No. 30 and 31 are illustrative of the unsuitability of mixtures of lanthanum oxide and ferric oxide as coatings prepared from mixtures of these oxides are also electrically non-conducting.

Samples No. 23, 24 and 29 are indicative of the unsuitability of coatings respectively consisting entirely of lanthanum oxide, cuprous oxide or ferric oxide; satisfactory coatings being produced only when a mixture of lanthanum and cuprous oxides is employed or a mixture of these oxides plus ferric oxide, the presence of the latter believed to promote lower resistivity at higher lanthanum oxide ratios and appears to improve somewhat the adherence of the coating to the beryllium oxide substrate.

It is to be further borne in mind that although the invention has been described with particular reference to its applicability to shunted gap-type igniter plugs, the inventive concept may be used in a variety of electrical semi-conducting applications, such as for example, in printed circuit patterns, high temperature resistors, grounding shunts for various electrical components and the like, which varying applications would be readily apparent to one skilled in the art, as the crux of the invention resides in providing an electrically semi-conducting coating that is suitable for application to a beryllium oxide ceramic insulating material. As regards the coating composition itself, it is to be understood that the use of ferric oxide as a constituent of the mixture is optional and is not critical to the formation of a satisfactory semi-conducting coating, the essential constitutents of the coating being lanthanum oxide and cuprous oxide. In addition, although the metal oxide coating of the invention is particularly intended for application to beryllium oxide ceramic substrates, it may also be applied to insulating bodies composed of, for example, aluminum oxides.

TABLE 1

| Sample No. | Composition, Percent by Weight | | | Resistance, Ohms $\times 10^4$ at 22°C After Firing at Indicated Temperature | | | |
|---|---|---|---|---|---|---|---|
| | $La_2O_3$ | $Cu_2O$ | $Fe_2O_3$ | 2150°F | 2250°F | 2350°F | 2450°F |
| 1 | 25 | 75 | 0 | 20 | 20 | 10 | — |
| 2 | 30 | 70 | 0 | 30 | 40 | 15 | — |
| 3 | 45 | 55 | 0 | 30 | 10 | 30 | — |
| 4 | 50 | 50 | 0 | 25 | 15 | 15 | — |
| 5 | 50 | 45 | 5 | 20 | 15 | 40 | — |
| 6 | 55 | 45 | 0 | 10 | 20 | 20 | — |
| 7 | 55 | 40 | 5 | 6 | 5 | 5 | 50 |
| 8 | 60 | 35 | 5 | 6 | 5 | 5 | 100 |
| 9 | 65 | 35 | 0 | 10 | 20 | 50 | — |
| 10 | 65 | 30 | 5 | 6 | 6 | 10 | 100 |
| 11 | 65 | 25 | 10 | 5 | 7 | 4 | — |
| 12 | 65 | 15 | 20 | 3 | 4 | 20 | — |
| 13 | 65 | 10 | 25 | 3 | 2 | 4 | — |
| 14 | 70 | 25 | 5 | 8 | 10 | 15 | 50 |
| 15 | 70 | 15 | 15 | 3 | 3 | 5 | 100 |
| 16 | 75 | 25 | 0 | 10 | 7 | 15 | — |
| 17 | 75 | 20 | 5 | 6 | 10 | 10 | 20 |

TABLE 1-continued

| Sample No. | Composition, Percent by Weight | | | Resistance, Ohms × $10^4$ at 22°C After Firing at Indicated Temperature | | | |
|---|---|---|---|---|---|---|---|
| | $La_2O_3$ | $Cu_2O$ | $Fe_2O_3$ | 2150°F | 2250°F | 2350°F | 2450°F |
| 18 | 75 | 15 | 10 | 5 | 3 | 20 | — |
| 19 | 75 | 10 | 15 | 5 | 5 | 15 | 200 |
| 20 | 80 | 15 | 5 | 6 | 10 | 10 | 50 |
| 21 | 85 | 15 | 0 | 10 | 10 | 4 | — |
| 22 | 85 | 10 | 5 | 10 | 10 | 20 | 50 |
| 23 | 100 | 0 | 0 | Infinite | Infinite | Infinite | — |
| 24 | 0 | 100 | 0 | Infinite | Infinite | Infinite | — |
| 25 | 0 | 92 | 8 | Infinite | Infinite | Infinite | — |
| 26 | 0 | 85 | 15 | Infinite | Infinite | Infinite | — |
| 27 | 0 | 75 | 25 | Infinite | Infinite | Infinite | — |
| 28 | 0 | 65 | 35 | Infinite | Infinite | Infinite | — |
| 29 | 0 | 0 | 100 | Infinite | Infinite | Infinite | — |
| 30 | 80 | 0 | 20 | Infinite | Infinite | Infinite | — |
| 31 | 90 | 0 | 10 | Infinite | Infinite | Infinite | — |

What is claimed is:

1. An electrically semi-conducting coating composition suitable for coating beryllium oxide electric insulators, said coating composition consisting essentially of a mixture of from 25 to 90 percent by weight of lanthanum oxide, from 5 to 75 percent by weight of cuprous oxide and from 0 to 25 percent by weight of ferric oxide.

2. The coating composition of claim 1 consisting essentially of a mixture of from 65 to 90 percent by weight of lanthanum oxide, from 10 to 30 percent by weight of cuprous oxide and from 0 to 5 percent by weight of ferric oxide.

* * * * *